(12) United States Patent
Liu et al.

(10) Patent No.: US 12,101,086 B2
(45) Date of Patent: Sep. 24, 2024

(54) NEGATIVE VOLTAGE LEVEL CONVERSION CONTROL CIRCUIT AND METHOD

(71) Applicant: SMARTER MICROELECTRONICS (GUANG ZHOU) CO., LTD., Guangzhou (CN)

(72) Inventors: Chifeng Liu, Guangzhou (CN); Xin Zhang, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 152 days.

(21) Appl. No.: 18/064,250

(22) Filed: Dec. 9, 2022

(65) Prior Publication Data

US 2023/0108055 A1    Apr. 6, 2023

Related U.S. Application Data

(63) Continuation of application No. PCT/CN2021/102924, filed on Jun. 29, 2021.

(30) Foreign Application Priority Data

Sep. 15, 2020    (CN) .......................... 202010970861.8

(51) Int. Cl.
*H03K 19/00* (2006.01)
*H03K 17/687* (2006.01)
*H03K 19/017* (2006.01)
*H03K 19/0185* (2006.01)

(52) U.S. Cl.
CPC ....... *H03K 19/0013* (2013.01); *H03K 17/687* (2013.01); *H03K 19/017* (2013.01); *H03K 19/0185* (2013.01)

(58) Field of Classification Search
CPC ............. H03K 19/0013; H03K 17/687; H03K 19/017; H03K 19/0185
See application file for complete search history.

(56) References Cited

U.S. PATENT DOCUMENTS

| | | | |
|---|---|---|---|
| 2005/0195676 A1* | 9/2005 | Suzuki | H02M 3/07 365/230.06 |
| 2019/0165771 A1* | 5/2019 | Masaoka | G09G 3/20 |

* cited by examiner

*Primary Examiner* — Daniel D Chang
(74) *Attorney, Agent, or Firm* — Syncoda LLC; Feng Ma

(57) ABSTRACT

A negative voltage level conversion control circuit comprises a negative voltage generation circuit, a bias circuit, and a level shift unit circuit, wherein an output end of the bias circuit is connected to the level shift unit circuit, and the other end of the bias circuit is connected to the negative voltage generation circuit; an output end of the negative voltage generation circuit is connected to the level shift unit circuit; the bias circuit is configured to receive an enable signal and output a bias voltage; the bias voltage is used for controlling a switching process of the level shift unit circuit; the enable signal is used for enabling the bias circuit and the negative voltage generation circuit.

9 Claims, 8 Drawing Sheets

NEGATIVE VOLTAGE LEVEL CONVERSION CONTROL CIRCUIT AND METHOD

CROSS-REFERENCE TO RELATED APPLICATIONS

This a continuation of International Patent Application No. PCT/CN2021/102924 filed on Jun. 29, 2021, which claims priority to Chinese Patent Application No. 202010970861.8 filed on Sep. 15, 2020. The disclosures of the-above-referenced applications are hereby incorporated by reference in their entirety.

BACKGROUND

A circuit for controlling negative voltage level conversion is a very common circuit module in an IC system, and has a main function of performing conversion between different levels, including conversion from a positive voltage to a positive voltage or conversion from a positive voltage to a negative voltage, such as conversion from 1.8 V to 3.3 V, or conversion from 2.5 V to −2.5V, or the like.

In some implementations, the circuit for controlling negative voltage level conversion includes a negative voltage generation circuit and a level shift unit circuit, here an input end of the level shift unit circuit may be input with a zero level or a positive level, and taking input with the positive level as an example, the level is converted to another positive level and a negative level at an output end. However, according to such level conversion, each path may be turned on instantaneously during switching, that is, there is a leakage path from a positive voltage to a negative voltage. Furthermore, due to a large span from the positive voltage to the negative voltage, a large number of charges are consumed in a process of turning on instantaneously, which may lead to a risk of pulling up a voltage of an output end of the negative voltage generation circuit, and then performance of subsequent circuits is affected.

SUMMARY

The disclosure relates to technologies of integrated circuit (IC), and in particular to a circuit and method for controlling negative voltage level conversion.

The disclosure provides a circuit and method for controlling negative voltage level conversion.

Technical solutions of the disclosure are implemented as follows.

The disclosure provides a circuit for controlling negative voltage level conversion, including a negative voltage generation circuit, a bias circuit and a level shift unit circuit, here the bias circuit has an output end connected to the level shift unit circuit and another end connected to the negative voltage generation circuit, and an output end of the negative voltage generation circuit is connected to the level shift unit circuit, and the bias circuit is configured to receive an enable signal enabling the bias circuit and the negative voltage generation circuit, to output a bias voltage controlling a switching process of the level shift unit circuit.

In some embodiments, the circuit for controlling negative voltage level conversion may further include a first delay unit having an input end receiving the enable signal and an output end connected to the negative voltage generation circuit.

In some embodiments, the circuit for controlling negative voltage level conversion may further include a second delay unit having an input end receiving the enable signal and an output end connected to the bias circuit, here a delay time of the first delay unit is greater than a delay time of the second delay unit.

In some embodiments, an end of the bias circuit may be connected to a direct-current (DC) power supply pulling up the bias voltage before the bias circuit is enabled.

In some embodiments, an end of the level shift unit circuit may be connected to the DC power supply.

In some embodiments, the bias circuit may be configured to divide a voltage between the DC power supply and the output end of the negative voltage generation circuit after the bias circuit is enabled, to obtain the bias voltage.

The disclosure further provides a method for controlling negative voltage level conversion, here the method is applied to a circuit for controlling negative voltage level conversion, which includes a negative voltage generation circuit, a bias circuit and a level shift unit circuit, here the bias circuit has an output end connected to the level shift unit circuit and another end connected to the negative voltage generation circuit, and an output end of the negative voltage generation circuit is connected to the level shift unit circuit, the method includes the following operations.

An enable signal enabling the bias circuit and the negative voltage generation circuit is received by the bias circuit, to output a bias voltage controlling a switching process of the level shift unit circuit.

In some embodiments, an end of the bias circuit may be connected to a DC power supply, and the method may further include the following operations.

The bias voltage is pulled up by the DC power supply, before the bias circuit is enabled.

In some embodiments, the method may further include the following operations.

A voltage between the DC power supply and the output end of the negative voltage generation circuit is divided by the bias circuit, after the bias circuit is enabled, to obtain the bias voltage.

The disclosure provides a circuit and method for controlling negative voltage level conversion, the circuit for controlling negative voltage level conversion includes a negative voltage generation circuit, a bias circuit and a level shift unit circuit, here the bias circuit has an output end connected to the level shift unit circuit and another end connected to the negative voltage generation circuit, and an output end of the negative voltage generation circuit is connected to the level shift unit circuit, and the bias circuit is configured to receive an enable signal enabling the bias circuit and the negative voltage generation circuit, to output a bias voltage controlling a switching process of the level shift unit circuit. In this way, by adding the bias circuit controlling the level shift unit circuit, a speed of the level shift unit circuit discharging to ground is accelerated, thereby shortening the time of turning on instantaneously during level conversion, and further accelerating a switching speed of the level shift unit Timing control of the enable signal reduces consumption of charges of the negative voltage generation circuit and reduces a risk of voltage at the output end of the negative voltage generation circuit being pulled up. Furthermore, control of a bias voltage at the output end of the bias circuit may effectively reduce a risk of occurrence of overvoltage in the level shift unit circuit when the negative voltage generation circuit operates.

DETAILED DESCRIPTION

The disclosure will be further described in detail below with reference to the accompanying drawings and embodiments. It should be understood that specific embodiments described here are only intended to explain the disclosure, but not to limit the disclosure.

During operation, IC usually requires different voltages for different application scenarios. For example, in a high-speed chip interface circuit, different level domains cannot be interconnected directly there-between, and corresponding level conversion circuits are required to implement connection.

Figure 1A:
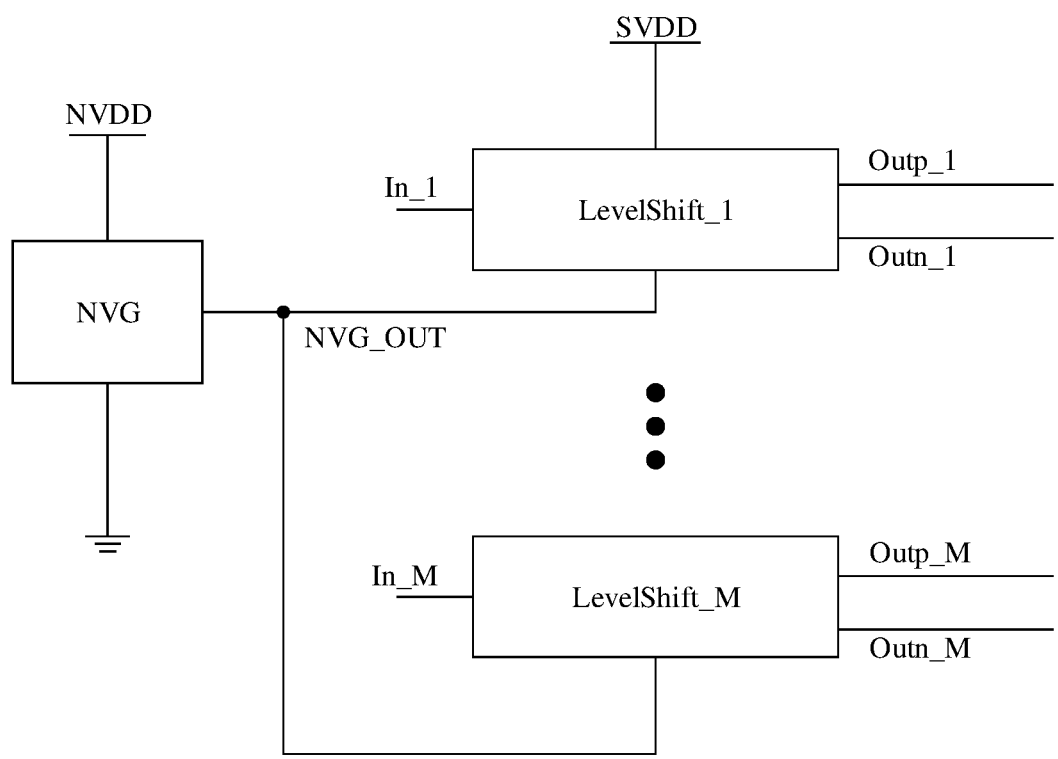
FIG. 1A is a schematic structural diagram of a circuit for controlling negative voltage level conversion in some implementations.

FIG. 1A is a schematic structural diagram of a circuit for controlling negative voltage level conversion in some implementations. As shown in FIG. 1A, the circuit for controlling negative voltage level conversion includes a negative voltage generation circuit NVG and M level shift units LevelShift_1~LevelShift_M, here M is an integer greater than or equal to 1. The negative voltage generation circuit NVG is connected between a DC power supply NVDD and a ground node, and has an output signal NVG_OUT sent to M level shift units LevelShift_1~LevelShift_M, and the M level shift units have M input ends In_1~In_M and 2M output ends which are output ends Outp_1~Outp_M and output ends Outn_1~Outn_M respectively. Each of the level shift units is connected between a DC power supply SVDD and an output end of the NVG.

Here each of the input ends In_1~In_M of the M level shift units may has a ground level or a positive level. Taking the input having the positive level as an example, the positive level is converted to another positive level at the output ends Outp_1~Outp_M, and the positive level is converted to a negative level at the output ends Outn_1~Outn_M.

Figure 1B:
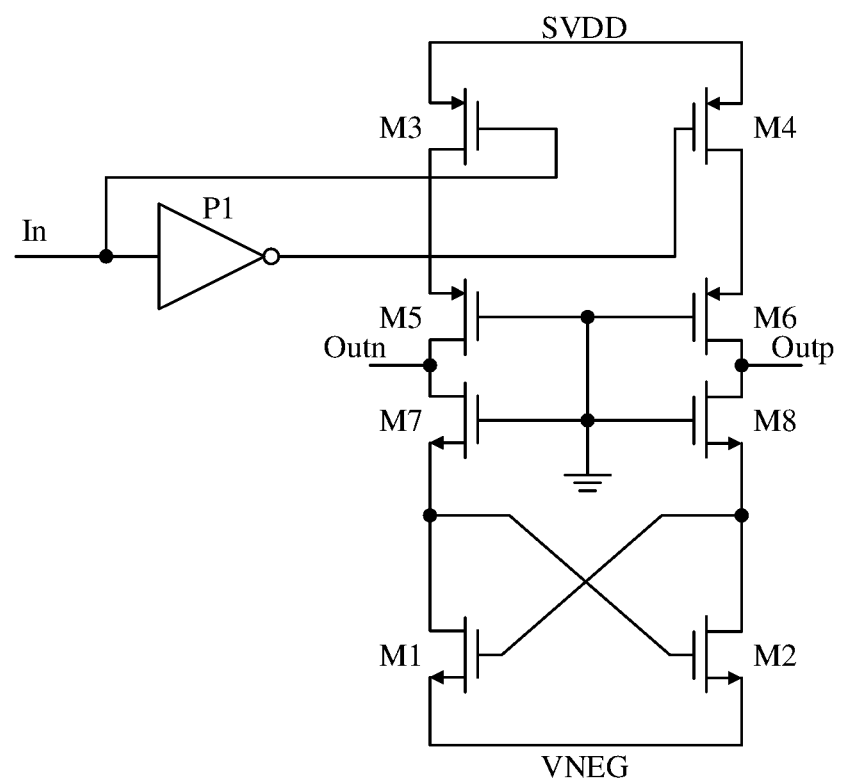
FIG. 1B is a schematic diagram of a level shift unit circuit in some implementations.

FIG. 1B is a schematic diagram of a level shift unit circuit in some implementations. As shown in FIG. 1B, it takes one level shift unit of the level shift unit circuit as an example to illustrate, the level shift unit includes a first inverter P1 and eight Metal Oxide Semiconductor Field Effect Transistors (MOSFET), here a third MOS transistor M3, a fourth MOS transistor M4, a fifth MOS transistor M5 and a sixth MOS transistor M6 are P-channel Metal Oxide Semiconductor (PMOS) transistors, and a first MOS transistor M1, a second MOS transistor M2, a seventh MOS transistor M7 and an eighth MOS transistor M8 are N-channel Metal Oxide Semiconductor (NMOS) transistors. In is an input end of the level shift unit, and Outn and Outp are outputs ends of the level shift unit.

As may be seen from FIG. 1B, the first inverter P1 receives an input signal In and outputs an inversion signal. A gate of the third MOS transistor M3 is connected to an input end of the first inverter P1, a gate of the fourth MOS transistor M4 is connected to an output end of the first inverter P1, a source of the third MOS transistor M3 and a source of the fourth MOS transistor M4 are connected to the DC power supply SVDD, a drain of the fourth MOS transistor M4 is connected to a source of the sixth MOS transistor M6, a drain of the third MOS transistor M3 is connected to a source of the fifth MOS transistor M5, a drain of the fifth MOS transistor M5 and a drain of the seventh MOS transistor M7 are connected to the output end Outn, a drain of the sixth MOS transistor M6 and a drain of the eighth MOS transistor M8 are connected to the output end Outp. A gate of the fifth MOS transistor M5, a gate of the sixth MOS transistor M6, a gate of the seventh MOS transistor M7 and a gate of the eighth MOS transistor M8 are connected to ground. A source of the seventh MOS transistor M7, a gate of the second MOS transistor M2 and a drain of the first MOS transistor M1 are connected together. A source of the eighth MOS transistor M8, a gate of the first MOS transistor M1 and a drain of the second MOS transistor M2 are connected together. A source of the first MOS transistor M1 and a source of the second MOS transistor M2 are connected to a VNEG end.

Here the VNEG end is usually connected to the output end of the negative voltage generation circuit NVG; when the input signal In is at a positive level, it passes through the first inverter P1, to enable the gate of the fourth MOS transistor M4 to be at a low level. Since a voltage between the source and the gate of the fourth MOS transistor M4 is greater than a threshold voltage Vthp of the PMOS transistor, to enable the fourth MOS transistor M4 to be turned on. Turning on the fourth MOS transistor M4 may raise voltage at the source of the sixth MOS transistor M6. Since the gate of the sixth MOS transistor M6 is connected to ground, a voltage between the source and the gate of the sixth MOS transistor M6 is greater than the threshold voltage Vthp of the PMOS transistor, to enable the sixth MOS transistor M6 to be turned on. Turning on the fourth MOS transistor M4 and the sixth MOS transistor M6 may raise voltage at the drain of the eighth MOS transistor M8, and when the VNEG end is at a negative level, since a voltage between the gate of the eighth MOS transistor M8 and the source of the second MOS transistor M2 is a difference between a ground level GND and the negative level VNEG, so that an equivalent capacitor exists between the gate and the source of the eighth MOS transistor M8, and an equivalent on-resistor or an off-capacitor exists between the drain and the source of the second MOS transistor M2. In this way, a certain voltage is shared between the gate and the source of the eighth MOS transistor M8, and this voltage is greater than a threshold voltage Vthn of NMOS and sufficient to turn the eighth MOS transistor M8 on. Furthermore, each of the first MOS transistor M1 and the second MOS transistor M2 is initially in an off state, and a current path formed by turning on the fourth MOS transistor M4, the sixth MOS transistor M6 and the eighth MOS transistor M8 charges the gate of the first MOS transistor M1, to enable the first MOS transistor M1 to be turned on, and since the first MOS transistor M1 is turned on, voltage at the gate of the second MOS transistor M2 and voltage at the source of the seventh MOS transistor M7 are pulled down to the negative level VNEG, to enable the second MOS transistor M2 to be turned off. Furthermore, since the gate of the seventh MOS transistor M7 is at the ground level, a voltage between the source and the gate of the seventh MOS transistor M7 is greater than the threshold voltage Vthn of the NMOS transistor, to enable the seventh MOS transistor M7 to be turned on, so that the output signal Outn is pulled down to the negative level VNEG and the output signal Outp is at a positive level SVDD. Similarly, when the input signal In is at the ground level, the output signal Outp is at the negative level VNEG and the output signal Outn is at the positive level SVDD. From an operating principle analyzed according to the above circuit, it may be known that the circuit for controlling negative voltage level conversion implements conversion of a logic level from the ground level GND to the positive level SVDD into another logic level from the negative level VNEG to the positive level SVDD.

In related art, according to such conversion, each path may be turned on instantaneously in a level switching process, that is, there is a leakage path from the positive level SVDD to the negative level VNEG. Furthermore, such conversion is conversion between SVDD and VNEG, that is, conversion between a positive voltage and a negative voltage. Due to a large span from the positive voltage to the negative voltage, a large number of charges are consumed in a process of turning on instantaneously, which may lead to a risk of pulling up a voltage of an output end of the negative voltage generation circuit, and then performance of subsequent circuits is affected.

Figure 1C:
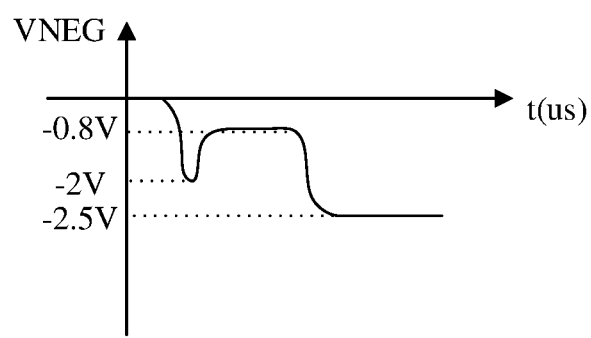
FIG. 1C is a schematic diagram of variation of voltage at an output end of a negative voltage generation circuit during level switching in some implementations.

FIG. 1C is a schematic diagram of variation of voltage at an output end of a negative voltage generation circuit during level switching in some implementations. As shown in FIG. 1C, a horizontal axis represents time t, and the unit thereof is us, and a vertical axis represents voltage VNEG at the output end of the negative voltage generation circuit, and the unit thereof is V. It may be seen that in a process of turning on the negative voltage generation circuit, that is, during voltage VNEG at the output end of the negative voltage generation circuit from zero level to −2.5V, the voltage is pulled up from −2V to −0.8V. That is, there is a risk that voltage at the output end of the negative voltage generation circuit may be pulled up during level switching. However, performance of subsequent circuits may be affected when voltage at the output end of the negative voltage generation circuit is pulled up.

Furthermore, before the negative voltage generation circuit is enabled, a VNEG end of the level shift unit circuit is at the ground level GND. After the negative voltage generation circuit is enabled, VNEG varies from the ground level to a negative level, which may also lead to a risk of occurrence of overvoltage in the MOS transistor of the level shift unit circuit.

In view of defects and application scenarios of the above technologies, the following embodiments are proposed.

Figure 2:
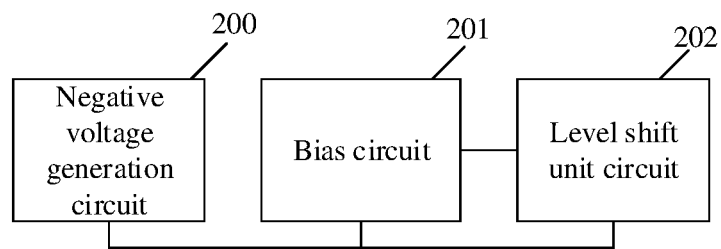
FIG. 2 is a schematic diagram of a circuit for controlling negative voltage level conversion according to an embodiment of the disclosure.

FIG. 2 is a schematic diagram of a circuit for controlling negative voltage level conversion according to an embodiment of the disclosure. As shown in FIG. 2, the circuit for controlling negative voltage level conversion includes a negative voltage generation circuit 200, a bias circuit 201 and a level shift unit circuit 202, here the bias circuit 201 has an output end connected to the level shift unit circuit 202 and another end connected to an output end of the negative voltage generation circuit 200, and the output end of the negative voltage generation circuit 200 is connected to the level shift unit circuit 202, and the bias circuit 201 is configured to receive an enable signal enabling the bias circuit 201 and the negative voltage generation circuit 200, to output a bias voltage controlling a switching process of the level shift unit circuit 202.

Here the negative voltage generation circuit provides the level shift unit circuit with a negative level for level switching, here a value of the negative level may be set according to an actual application, for example, −2.5V, −3V, or the like, which is not limited in the embodiment of the disclosure.

In the embodiment of the disclosure, the level shift unit circuit includes at least one level shift unit, here each level shift unit has an end connected to a DC power supply to obtain power supply and another end connected to the output end of the negative voltage generation circuit. When the level shift unit circuit includes multiple level shift units, the level shift unit circuit includes a branch formed by multiple level shift units connected in parallel.

In some embodiments, the enable signal is similar to a trigger signal, and when an associated circuit is enabled by the enable signal, the associated circuit may be controlled to turn on certain functions, thereby ensuring normal operation of the associated circuit.

In an embodiment of the disclosure, when the bias circuit is enabled by the enable signal, a voltage dividing function of the bias circuit may be turned on. When the negative voltage generation circuit is enabled by the enable signal, a function for generating a negative voltage of the negative voltage generation circuit may be turned on.

In some embodiments, an end of the bias circuit may be connected to a DC power supply pulling up the bias voltage before the bias circuit is enabled.

In an embodiment of the disclosure, before the bias circuit is enabled, that is, when the enable signal does not enter the bias circuit, the DC power supply not only supplies power to the bias circuit, but also may pull up a bias voltage at the output end of the bias circuit. The output end of the bias circuit is connected to the level shift unit circuit, therefore, when the bias voltage at the output end of the bias circuit is pulled up before the bias circuit is enabled, a voltage difference between the gate and the source of the NMOS transistor in the level shift unit circuit may be increased, so that a speed of discharging to ground is accelerated, thereby shortening the time of turning on instantaneously during level conversion, that is, accelerating a switching speed of the level shift unit circuit.

In some embodiments, an end of the level shift unit circuit may be connected to the DC power supply. Here the bias circuit and the level shift unit circuit may be connected to the same DC power supply to obtain power supply, or may be connected to different DC power supplies to obtain power supply. It may be set according to an actual application scenario, which is not limited in the embodiment of the disclosure.

Furthermore, when the bias circuit and the level shift unit circuit are connected to different DC power supplies, power supply voltages of the two circuits may be the same or different. For example, the bias circuit and the level shift unit circuit may be powered by a 3V DC power supply A and a 3V DC power supply B, respectively. Or, the bias circuit and the level shift unit circuit may be powered by a 3V DC power supply A and a 5V DC power supply C, respectively.

In some embodiments, when the 3V DC power supply A is connected before the bias circuit is enabled, the bias voltage at the output end of the bias circuit may be pulled up to 3V to accelerate a speed of the level shift unit circuit discharging to ground.

In some embodiments, the bias circuit may be configured to divide a voltage between the DC power supply and the output end of the negative voltage generation circuit after the bias circuit is enabled, to obtain the bias voltage.

In the embodiment of the disclosure, after the bias circuit is enabled, the bias voltage output by the bias circuit implements adaptively following according to the voltage between the DC power supply and the output end of the negative voltage generation circuit. When a voltage division ratio of the bias circuit is known, the bias voltage may be obtained according to the voltage between the DC power supply and the output end of the negative voltage generation circuit.

Here the voltage division ratio may be determined according to an actual circuit structure of the bias circuit. In case of different circuit structures, the voltage division ratio may be ½, ⅓, ¾, or the like, which is not limited in the embodiment of the disclosure.

In some embodiments, it is assumed that the DC power supply connected to the bias circuit is 3V, and a negative voltage at the output end of the negative voltage generation circuit is −2.5V, then a voltage difference between the DC power supply and the output end of the negative voltage generation circuit is 5.5 V. When the voltage division ratio of the bias circuit is ½, voltage divided by the bias circuit is 2.75 V, corresponding to a obtained bias voltage of 0.25 V.

In some embodiments, the circuit for controlling negative voltage level conversion may further include a first delay unit having an input end receiving the enable signal and an output end connected to the negative voltage generation circuit.

In the embodiment of the disclosure, the enable signal passes through the first delay unit, and then enables the negative voltage generation circuit, that is, the first delay unit may delay a time when the enable signal enables the negative voltage generation circuit. For example, when a delay time of the first delay unit is 10 us, the enable signal enables the negative voltage generation circuit after a delay time of 10 us.

In some embodiments, the circuit for controlling negative voltage level conversion may further include a second delay unit having an input end receiving the enable signal and an output end connected to the bias circuit, here a delay time of the first delay unit is greater than a delay time of the second delay unit.

In the embodiment of the disclosure, the enable signal passes through the second delay unit to delay its time, and then enables the bias circuit, that is, the second delay unit may delay a time when the enable signal enables the bias circuit. For example, when a delay time of the second delay unit is 5 us, the enable signal enables the negative voltage generation circuit after a delay time of 5 us.

In the embodiment of the disclosure, since the delay time of the first delay unit is greater than the delay time of the second delay unit, it means that the enable signal enables the bias circuit firstly, and then enables the negative voltage generation circuit. The enable signal may directly enable the bias circuit without passing through the second delay unit, or enable the bias circuit after subjecting to delay of the second delay unit.

In some embodiments, the delay time of the first delay unit may be twice the delay time of the second delay unit. For example, when the delay time of the first delay unit is 10 us and the delay time of the second delay unit is 5 us, the enable signal enables the bias circuit after a delay time of 5 us, and enables the negative pressure generation circuit after a delay time of 10 us. Here correspondences between the delay time of the first delay unit and the delay time of the second delay unit may be adjusted according to an actual circuit structure, as long as the delay time of the first delay unit is greater than the delay time of the second delay unit, which is not limited in the embodiment of the disclosure.

In some embodiments, each of the first delay unit and the second delay unit may include a combination of one or more delay units. A circuit structure of the delay unit may include resistors and capacitors, or may include other devices, which is not limited in the embodiment of the disclosure.

In some embodiments, the negative voltage generation circuit outputs a ground level when the enable signal enables the bias circuit and does not enable the negative voltage generation circuit. The bias circuit may divide a voltage between the DC power supply connected to the bias circuit and a ground level at the output end of the negative voltage generation circuit according to the voltage division ratio, therefore, a risk of occurrence of overvoltage in the level shift unit circuit when the negative voltage generation circuit is enabled is effectively reduced.

The disclosure provides a circuit and method for controlling negative voltage level conversion, the circuit for controlling negative voltage level conversion includes a negative voltage generation circuit, a bias circuit and a level shift unit circuit, here the bias circuit has an output end connected to the level shift unit circuit and another end connected to the negative voltage generation circuit, and an output end of the negative voltage generation circuit is connected to the level shift unit circuit, and the bias circuit is configured to receive an enable signal enabling the bias circuit and the negative voltage generation circuit, to output a bias voltage controlling a switching process of the level shift unit circuit. In this way, by adding the bias circuit controlling the level shift unit circuit, a speed of the level shift unit circuit discharging to ground is accelerated, thereby shortening the time of turning on instantaneously during level conversion, and further accelerating a switching speed of the level shift unit Timing control of the enable signal reduces consumption of charges of the negative voltage generation circuit and reduces a risk of voltage at the output end of the negative voltage generation circuit being pulled up. Furthermore, control of the bias voltage at the output end of the bias circuit may effectively reduce a risk of occurrence of overvoltage in the level shift unit circuit when the negative voltage generation circuit operates.

In order to better explain the purpose of the disclosure, illustration of further examples is given based on the above embodiments of the disclosure.

Figure 3A:
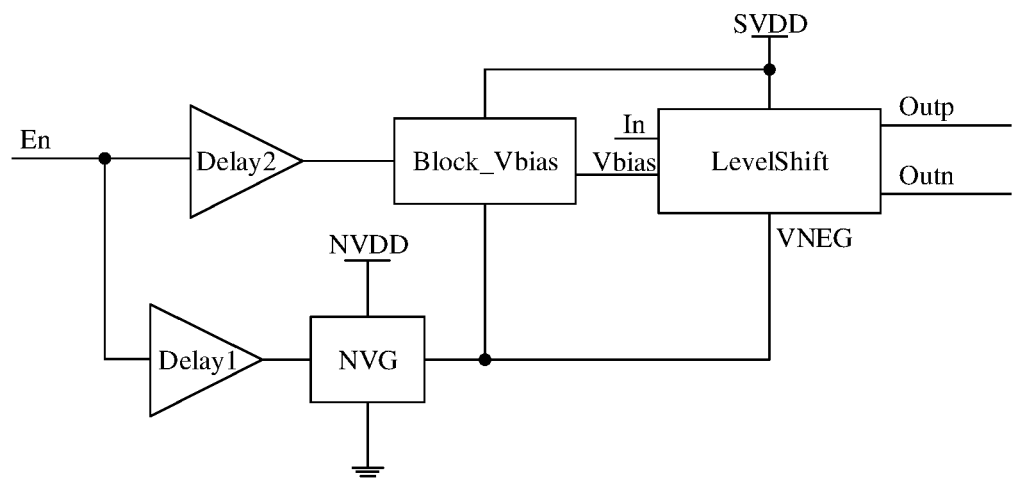
FIG. 3A is a schematic diagram of another circuit for controlling negative voltage level conversion according to an embodiment of the disclosure.

FIG. 3A is a schematic diagram of another circuit for controlling negative voltage level conversion according to an embodiment of the disclosure. As shown in FIG. 3A, the circuit includes a first delay unit Delay1, a second delay unit Delay2, a negative voltage generation circuit NVG, a bias circuit Block_Vbias, and a level shift unit circuit LevelShift. A DC power supply NVDD and a DC power supply SVDD supply power to the negative voltage generation circuit NVG and the level shift unit circuit LevelShift, respectively. En represents an enable signal, Vbias represents an output end of the bias circuit, In represents an input end of the level shift unit circuit LevelShift, and Outn and Outp represent output ends of the level shift unit circuit LevelShift.

The first delay unit Delay1 has an input end receiving the enable signal En and an output end connected to the negative voltage generation circuit NVG. The second delay unit Delay2 has an input end receiving the enable signal En and an output end connected to the bias circuit Block_Vbias. The bias circuit Block_Vbias has an output end connected to the level shift unit circuit LevelShift and another end connected to the negative voltage generation circuit NVG. An output end of the negative voltage generation circuit NVG is connected to the level shift unit circuit LevelShift.

The bias circuit Block_Vbias is configured to receive an enable signal En, to output a bias voltage. The bias voltage may control a switching process of the level shift unit circuit LevelShift, and implement adaptively following in the switching process. The enable signal En may enable the bias circuit Block_Vbias and the negative voltage generation circuit NVG.

Here the negative voltage generation circuit NVG represents the negative voltage generation circuit 200, the bias circuit Block_Vbias represents the bias circuit 201, and the level shift unit circuit LevelShift represents the level shift unit circuit 202.

Figure 3B:
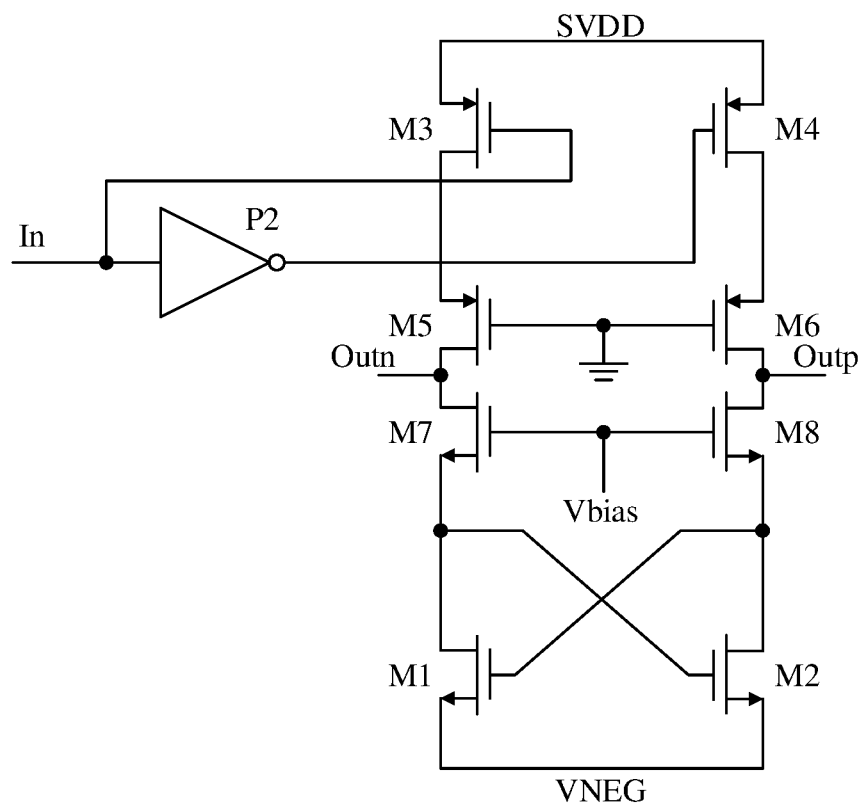
FIG. 3B is a schematic diagram of a level shift unit circuit according to an embodiment of the disclosure.

FIG. 3B is a schematic diagram of a level shift unit circuit according to an embodiment of the disclosure. Here it takes one level shift unit of the level shift unit circuit as an example to illustrate, it may be seen in conjunction with FIG. 1B that in FIG. 1B, the gate of the seventh MOS transistor M7 and the gate of the eighth MOS transistor M8 are connected to ground. However, in FIG. 3B of the embodiment of the disclosure, the gate of the seventh MOS transistor M7 and the gate of the eighth MOS transistor M8 are connected to the output end of the bias circuit.

Figure 3C:
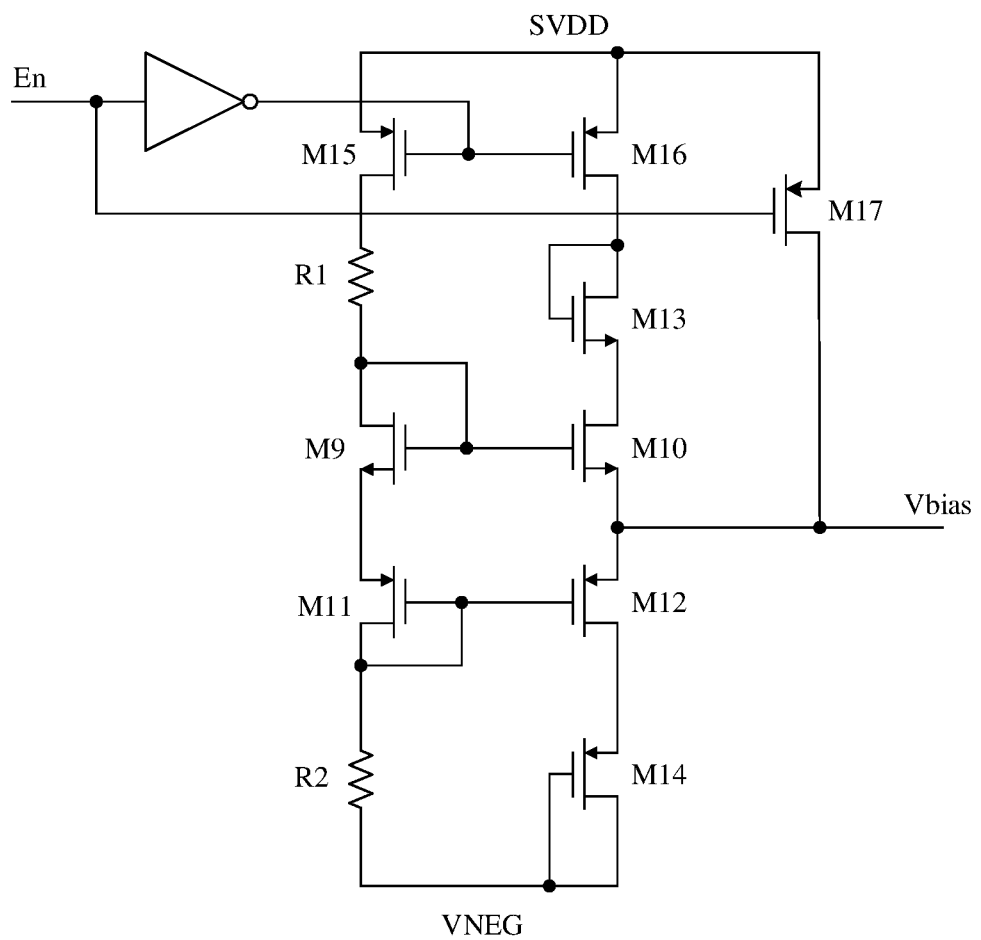
FIG. 3C is a schematic diagram of a bias circuit according to an embodiment of the disclosure.

FIG. 3C is a schematic diagram of a bias circuit according to an embodiment of the disclosure. As shown in FIG. 3C, the bias circuit includes a second inverter P2, a first resistor R1, a second resistor R2, and a ninth MOS transistor M9 to a seventeenth MOS transistor M17. Here the eleventh MOS transistor M11, the twelfth MOS transistor M12, the fourteenth MOS transistor M14, the fifteenth MOS transistor M15, the sixteenth MOS transistor M16 and the seventeenth MOS transistor M17 are PMOS transistors, and the ninth MOS transistor M9, the tenth MOS transistor M10 and the thirteenth MOS transistor M13 are NMOS transistors. In represent an input end of the level shift unit, and Outn and Outp represent output ends of the level shift unit. A DC power supply SVDD and a negative level VNEG provide a positive level and a negative level to the level shift unit respectively.

It may be seen in FIG. 3C that the second inverter P2 receives an enable signal En and outputs an inversion signal, a gate of the fifteenth MOS transistor M15 and a gate of the sixteenth MOS transistor M16 are connected to an output end of the second inverter P2, a gate of the seventeenth MOS transistor M17 is connected to an input end of the second inverter P2. A source of the fifteenth MOS transistor M15, a source of the sixteenth MOS transistor M16 and a source of the seventeenth MOS transistor M17 are connected to the DC power supply SVDD. A drain of the sixteenth MOS transistor M16, a drain of the thirteenth MOS transistor M13 and a gate of the thirteenth MOS transistor M13 are connected together. A source of the thirteenth MOS transistor M13 is connected to a drain of the tenth MOS transistor M10. A drain of the fifteenth MOS transistor M15 is connected to a drain of the ninth MOS transistor M9, a gate of the ninth MOS transistor M9 and a gate of the tenth MOS transistor M10 through the first resistor R1. A source of the tenth MOS transistor M10 and a source of the twelfth MOS transistor M12 are connected to the output end Vbias of the bias circuit. A source of the ninth MOS transistor M9 is connected to a source of the eleventh MOS transistor M11. A gate of the eleventh MOS transistor M11, a drain of the eleventh MOS transistor M11 and a gate of the twelfth MOS transistor M12 are connected together. The drain of the eleventh MOS transistor M11 is connected to a VNEG end through the second resistor R2. A drain of the twelfth MOS transistor M12 is connected to a source of the fourteenth MOS transistor M14. Drain and gate of the fourteenth MOS transistor M14 are connected to the VNEG end.

It may be seen in conjunction with FIG. 3A to FIG. 3C that before the bias circuit Block_Vbias is enabled, the gate of the seventeenth MOS transistor M17 in the bias circuit Block_Vbias is at a low level, to enable the seventeenth MOS transistor M17 to be turned on. The output end Vbias of the bias circuit Block_Vbias is pulled up to SVDD. Compared with a case where each of the gate of the seventh MOS transistors M7 and the gate of the eighth MOS transistors M8 in the level shift unit is at the ground level GND in FIG. 1B, each of the gate of the seventh MOS transistors M7 and the gate of the eighth MOS transistors M8 in the level shift unit in the embodiment of the disclosure is at a high level SVDD. Due to a larger voltage difference between the gate and the source, a speed of discharging to ground is accelerated, thereby shortening the time of turning on instantaneously in the conversion process. Then the enable signal En enables the bias circuit Block_Vbias after it is delayed by the second delay unit Delay2, and by adjusting the voltage division ratio of the bias circuit Block_Vbias, level at the output end Vbias of the bias circuit Block_Vbias implements adaptively following according to a voltage difference between SVDD and VNEG. Here the voltage division ratio of ½ is taken as an example, since the negative voltage generation circuit NVG is not enabled and the VNEG end is at the ground level GND, the output end Vbias of the bias circuit Block_Vbias is switched to SVDD/2, which avoids a risk of occurrence of overvoltage in the level shift unit circuit due to the VNEG end dropping from the ground level to the negative level, after the negative voltage generation circuit NVG is enabled. After it is delayed by the first delay unit Delay1, the negative voltage generation circuit NVG is enabled, the VNEG end is switched to be at the negative level, and the output end Vbias of the bias circuit Block_Vbias also decreases along with the negative level VNEG.

Figure 3D:
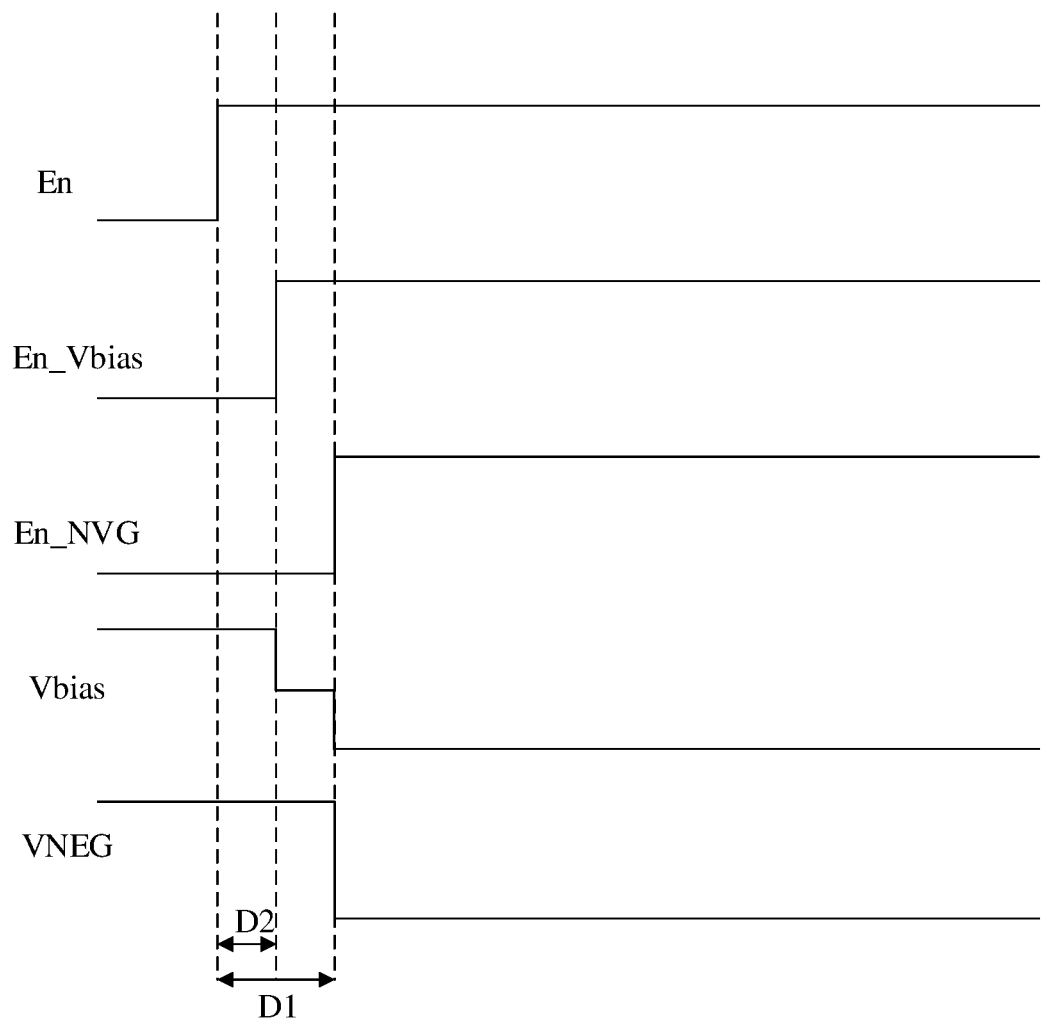
FIG. 3D is a schematic diagram of a timing waveform of a circuit for controlling negative voltage level conversion during level conversion provided by an embodiment of the disclosure.

FIG. 3D is a schematic diagram of a timing waveform of a circuit for controlling negative voltage level conversion during level conversion provided by an embodiment of the disclosure. As shown in FIG. 3D, before the bias circuit Block_Vbias and the negative voltage generation circuit NVG are enabled, each of the enable signal En, an input end En_Vbias of the bias circuit and an input end En_NVG of the negative voltage generation circuit is at a low level, the output end Vbias of the bias circuit Block_Vbias is at a high level, and the negative voltage generation circuit NVG makes the output end VNEG at the ground level. During a delay time D2 of the second delay unit Delay2, only the enable signal En is at a high level, and levels of the remaining ends remain the same. During a duration when the delay time D2 of the second delay unit Delay2 expires and a delay time D1 of the first delay unit Delay1 does not expire, the input end En_Vbias of the bias circuit Block_Vbias is at a high level, the output end Vbias of the bias circuit Block_Vbias is at half of the high level, here the voltage division ratio of the bias circuit is taken as ½ for example. After the delay time D1 of the first delay unit Delay1 expires, the output end VNEG of the negative voltage generation circuit NVG is at a negative level, and level at the output end Vbias of the bias circuit Block_Vbias decreases along with level at the output end VNEG of the negative voltage generation circuit NVG.

In the whole level switching process, the bias voltage output by the bias circuit implements adaptively following according to a voltage difference between a positive voltage and a negative voltage. In this process, the level shift unit circuit firstly performs conversion from a positive level to a ground level domain, and then performs conversion from a positive level to a negative level domain, thereby reducing consumption of charges of the negative voltage generation circuit, reducing a risk of voltage at the output end of the negative voltage generation circuit being pulled up, and ensuring performance of subsequent circuits.

An embodiment of the disclosure also provides a method for controlling negative voltage level conversion, here the method is applied to a circuit for controlling negative voltage level conversion, which includes a negative voltage generation circuit, a bias circuit and a level shift unit circuit, here the bias circuit has an output end connected to the level shift unit circuit and another end connected to the negative voltage generation circuit, and an output end of the negative voltage generation circuit is connected to the level shift unit circuit. The method includes the following operations.

An enable signal enabling the bias circuit and the negative voltage generation circuit is received by the bias circuit, to output a bias voltage controlling a switching process of the level shift unit circuit.

It should be noted that a circuit structure diagram of the level shift unit circuit proposed in the embodiment of the disclosure is not limited to the circuit structure described in FIG. 3B and is also applicable to circuit structures of other level shift unit circuits, and a circuit structure diagram of the bias circuit proposed in the embodiment of the disclosure is not limited to the circuit structure described in FIG. 3C and is also applicable to circuit structures of other bias circuits, which is not limited in the embodiment of the disclosure.

The above descriptions are only specific implementations of the disclosure, however, the scope of protection of the disclosure is not limited thereto. Variation or replacement readily conceivable by any person skilled in the art within the technical scope of the disclosure shall fall within the scope of protection of the disclosure. Therefore, the scope of protection of the disclosure should be subjected to the scope of protection of the claims.

What is claimed is:

1. A circuit for controlling negative voltage level conversion, comprising: a negative voltage generation circuit, a bias circuit and a level shift unit circuit,
   wherein the bias circuit has an output end connected to the level shift unit circuit and another end connected to the negative voltage generation circuit, and an output end of the negative voltage generation circuit is connected to the level shift unit circuit, and
   the bias circuit is configured to receive an enable signal enabling the bias circuit and the negative voltage generation circuit, to output a bias voltage controlling a switching process of the level shift unit circuit.

2. The circuit of claim 1, further comprising a first delay unit having an input end receiving the enable signal and an output end connected to the negative voltage generation circuit.

3. The circuit of claim 2, further comprising a second delay unit having an input end receiving the enable signal and an output end connected to the bias circuit,
   wherein a delay time of the first delay unit is greater than a delay time of the second delay unit.

4. The circuit of claim 1, wherein an end of the bias circuit is connected to a direct-current (DC) power supply pulling up the bias voltage before the bias circuit is enabled.

5. The circuit of claim 4, wherein an end of the level shift unit circuit is connected to the DC power supply.

6. The circuit of claim 5, wherein the bias circuit is configured to divide a voltage between the DC power supply and the output end of the negative voltage generation circuit after the bias circuit is enabled, to obtain the bias voltage.

7. A method for controlling negative voltage level conversion, applied to a circuit for controlling negative voltage level conversion, which comprises a negative voltage generation circuit, a bias circuit and a level shift unit circuit, wherein the bias circuit has an output end connected to the level shift unit circuit and another end connected to the negative voltage generation circuit, and an output end of the negative voltage generation circuit is connected to the level shift unit circuit, the method comprising:
   receiving, by the bias circuit, an enable signal enabling the bias circuit and the negative voltage generation circuit, to output a bias voltage controlling a switching process of the level shift unit circuit.

8. The method of claim 7, wherein an end of the bias circuit is connected to a direct-current (DC) power supply, and the method further comprises:
   pulling up, by the DC power supply, the bias voltage before the bias circuit is enabled.

9. The method of claim 8, further comprising:
   dividing, by the bias circuit, a voltage between the DC power supply and the output end of the negative voltage generation circuit after the bias circuit is enabled, to obtain the bias voltage.

* * * * *